（12） United States Patent
Itose et al.

(10) Patent No.: US 9,214,519 B2
(45) Date of Patent: Dec. 15, 2015

(54) $IN_2O_3$—$SNO_2$—ZNO SPUTTERING TARGET

(75) Inventors: Masayuki Itose, Sodegaura (JP); Mami Nishimura, Sodegaura (JP); Misa Sunagawa, Sodegaura (JP); Masashi Kasami, Sodegaura (JP); Koki Yano, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 136 days.

(21) Appl. No.: 14/116,322

(22) PCT Filed: May 7, 2012

(86) PCT No.: PCT/JP2012/002985
§ 371 (c)(1),
(2), (4) Date: Dec. 11, 2013

(87) PCT Pub. No.: WO2012/153507
PCT Pub. Date: Nov. 15, 2012

(65) Prior Publication Data
US 2014/0103268 A1    Apr. 17, 2014

(30) Foreign Application Priority Data

May 10, 2011    (JP) .................................. 2011-105731

(51) Int. Cl.
*H01B 1/02* (2006.01)
*H01L 29/24* (2006.01)
(Continued)

(52) U.S. Cl.
CPC .............. *H01L 29/242* (2013.01); *C04B 35/01* (2013.01); *C04B 35/453* (2013.01);
(Continued)

(58) Field of Classification Search
CPC ...... C08B 35/01; C08B 35/45; H01L 29/242; C23C 14/34; C23C 14/35; C23C 14/46
USPC ........ 252/519.51, 520.1; 204/298.13; 257/43; 428/688; 174/126.1
See application file for complete search history.

(56) References Cited

U.S. PATENT DOCUMENTS 8,232,552 B2    7/2012  Yano et al.
8,524,123 B2 *  9/2013  Yano et al. ................. 252/520.1
(Continued)

FOREIGN PATENT DOCUMENTS

EP    1 717 335 A1    11/2006
EP    1 717 336 B1    11/2006
(Continued)

OTHER PUBLICATIONS

Translation of the International Preliminary Report on Patentability in International Application No. PCT/JP2012/002985 mailed Nov. 21, 2013; translation of Written Opinion of the International Searching Authority and International Search Report.
(Continued)

*Primary Examiner* — Khanh Tuan Nguyen
(74) *Attorney, Agent, or Firm* — Foley & Lardner LLP

(57) ABSTRACT

A sputtering target including indium (In), tin (Sn) and zinc (Zn) and an oxide including one or more elements X selected from the following group X,
the atomic ratio of the elements satisfying the following formulas (1) to (4):
Group X: Mg, Si, Al, Sc, Ti, Y, Zr, Hf, Ta, La, Nd, Sm $0.10 \leq In/(In+Sn+Zn) \leq 0.85$    (1)

$0.01 \leq Sn/(In+Sn+Zn) \leq 0.40$    (2)

$0.10 \leq Zn/(In+Sn+Zn) \leq 0.70$    (3)

$0.70 \leq In/(In+X) \leq 0.99$    (4).

8 Claims, 1 Drawing Sheet

(51) Int. Cl.
*C04B 35/01* (2006.01)
*C04B 35/453* (2006.01)
*C04B 35/457* (2006.01)
*C23C 14/08* (2006.01)
*C23C 14/34* (2006.01)
*H01L 21/02* (2006.01)

(52) U.S. Cl.
CPC ............ *C04B 35/457* (2013.01); *C23C 14/086* (2013.01); *C23C 14/3407* (2013.01); *C23C 14/3414* (2013.01); *C04B 2235/3206* (2013.01); *C04B 2235/3217* (2013.01); *C04B 2235/3224* (2013.01); *C04B 2235/3225* (2013.01); *C04B 2235/3227* (2013.01); *C04B 2235/3232* (2013.01); *C04B 2235/3244* (2013.01); *C04B 2235/3251* (2013.01); *C04B 2235/3284* (2013.01); *C04B 2235/3286* (2013.01); *C04B 2235/3293* (2013.01); *C04B 2235/3418* (2013.01); *C04B 2235/6562* (2013.01); *C04B 2235/6565* (2013.01); *C04B 2235/6567* (2013.01); *C04B 2235/6585* (2013.01); *C04B 2235/763* (2013.01); *C04B 2235/77* (2013.01); *C04B 2235/786* (2013.01); *C04B 2235/80* (2013.01); *C04B 2235/963* (2013.01); *H01L 21/02554* (2013.01); *H01L 21/02565* (2013.01); *H01L 21/02631* (2013.01)

(56) References Cited

U.S. PATENT DOCUMENTS

| | | | |
|---|---|---|---|
| 2004/0151942 A1* | 8/2004 | Anzaki et al. | 428/688 |
| 2007/0194379 A1 | 8/2007 | Hosono et al. | |
| 2009/0278122 A1 | 11/2009 | Hosono et al. | |
| 2009/0280600 A1 | 11/2009 | Hosono et al. | |
| 2010/0155717 A1* | 6/2010 | Yano et al. | 257/43 |
| 2010/0170696 A1* | 7/2010 | Yano | C04B 35/453 174/126.2 |
| 2011/0101352 A1 | 5/2011 | Hosono et al. | |
| 2011/0201162 A1 | 8/2011 | Hosono et al. | |
| 2011/0260121 A1 | 10/2011 | Yano et al. | |
| 2012/0012838 A1 | 1/2012 | Hosono et al. | |
| 2013/0112971 A1 | 5/2013 | Yano et al. | |
| 2013/0118774 A1 | 5/2013 | Yano et al. | |

FOREIGN PATENT DOCUMENTS

| | | | | |
|---|---|---|---|---|
| EP | 2 281 919 A1 | | 2/2011 | |
| JP | 2004-211159 | * | 7/2004 | ............ C23C 14/34 |
| JP | 2007-115431 A | | 5/2007 | |
| JP | 2008-243928 A | | 10/2008 | |
| JP | 4620046 B2 | | 1/2011 | |
| WO | WO-2005/078152 A1 | | 8/2005 | |
| WO | WO-2005/078153 A1 | | 8/2005 | |
| WO | WO 2007-026783 | * | 3/2007 | ............ C04B 35/00 |
| WO | WO 2008/117810 | * | 10/2008 | ............ H01L 29/786 |
| WO | WO 2009/147969 A1 | | 12/2009 | |
| WO | WO-2010/058533 A1 | | 5/2010 | |
| WO | WO-2010/067571 A1 | | 6/2010 | |

OTHER PUBLICATIONS

Saji et al., "Optical and Carrier Transport Properties of Cosputtered Zn-In-Sn-O Films and Their Applications to TFTs," Journal of the Electrochemical Society, vol. 155, No. 6, 2008, pp. H390-H395.

* cited by examiner

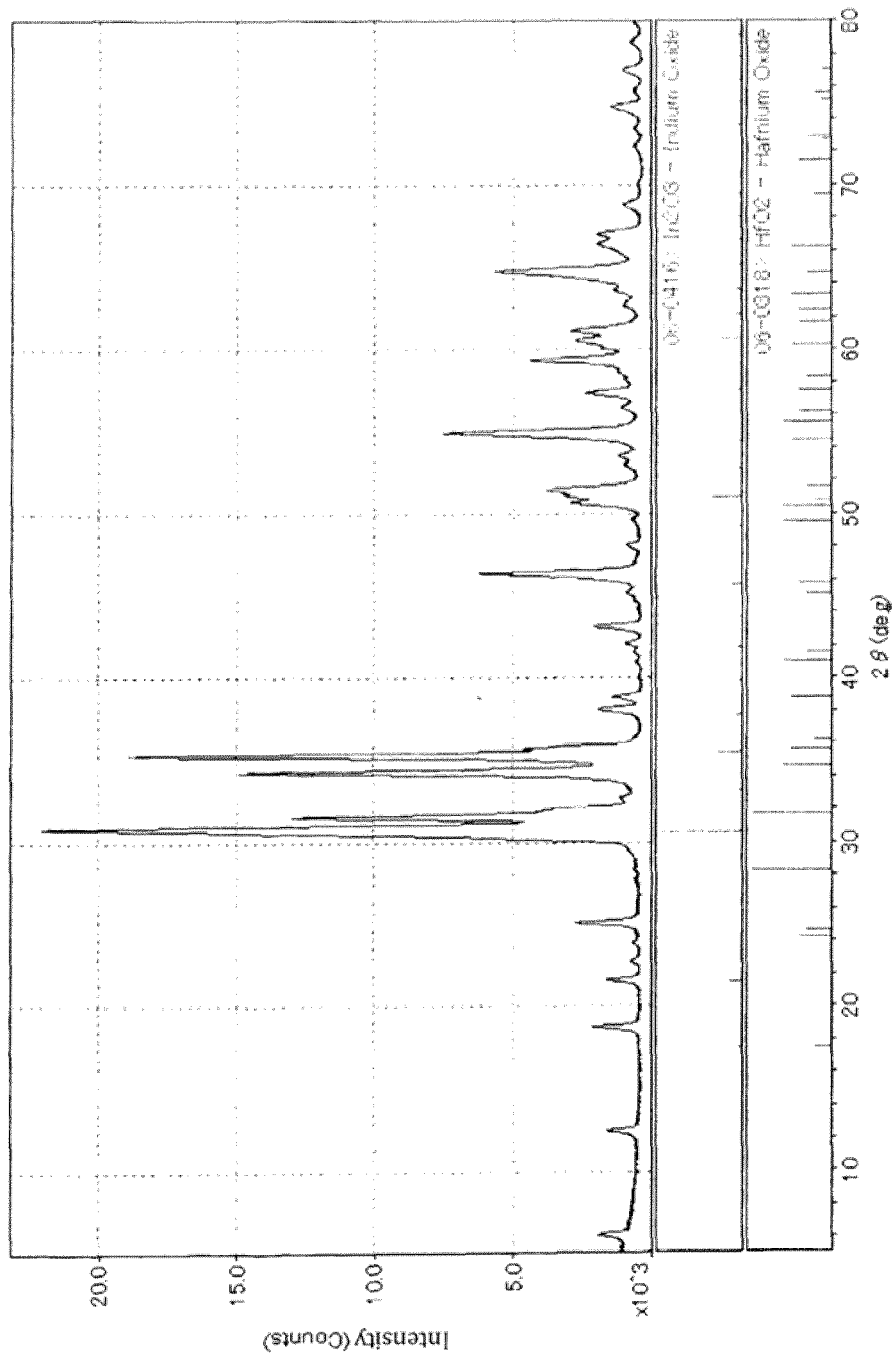

$In_2O_3$—$SnO_2$—ZnO SPUTTERING TARGET

This application is the National Phase of PCT/JP2012/002985, filed May 7, 2012, which claims priority to Japanese Application No. 2011-105731, filed May 10, 2011, the disclosures of which are hereby incorporated by reference in their entirety.

TECHNICAL FIELD

The invention relates to a sputtering target for forming an oxide thin film such as an oxide semiconductor and a transparent conductive film. In particular, the invention relates to a sputtering target suitable for forming an oxide thin film for use in a thin film transistor.

BACKGROUND ART

A field effect transistor is widely used as a unit electronic device of a semiconductor memory integrated circuit, a high-frequency signal amplifier, a liquid crystal driving device or the like, and is an electronic device which is most widely put into practical use. Of these electronic devices, with development of a display in recent years, not only in a liquid crystal display (LCD), but also in various displays such as an electroluminescence display device (EL) and a field emission display (FED), a thin film transistor (TFT) has been widely used as a switching element which allows a display to be driven by applying a driving voltage to a display element.

In a TFT driving element, a silicon-based semiconductor thin film has been most widely used. On the other hand, due to superior stability to that of a silicon-based semiconductor thin film, a transparent oxide semiconductor thin film has attracted attention.

Oxide semiconductor films include an oxide semiconductor film containing a crystalline substance composed mainly of zinc oxide, and many studies have been made on this film. However, when a film is formed by a sputtering method, which is generally performed on the industrial basis, an oxide semiconductor film containing a crystalline substance mainly composed of zinc oxide encounters a problem that it tends to suffer oxygen deficiency, a large number of carrier electrons are generated, and electric conductivity is hard to be decreased. In addition, there is also a problem that abnormal discharge occurs when film is formed by a sputtering method, stable film formation cannot be attained, resulting in deterioration of homogeneity and reproducibility of the resulting film.

Further, an oxide semiconductor film containing a crystalline substance composed mainly of zinc oxide has a low field effect mobility (hereinafter, often referred to as the "mobility") of about 1 $cm^2/V \cdot sec$. This film has a small on-off ratio and a tendency to occur current leakage easily. Therefore, when an oxide semiconductor film containing a crystalline substance composed mainly of zinc oxide is used as an active layer (channel layer) of a TFT, a large amount of current is flown between a source terminal and a drain terminal even when no gate voltage is applied, and as a result, a TFT cannot attain a normally-off operation. In addition, it is difficult to increase the on-off ratio of a transistor.

As mentioned above, a TFT obtained by using an oxide semiconductor film containing zinc oxide has disadvantages that TFT properties tend to be deteriorated, i.e. a low mobility, a low on-off ratio, a large amount of current leakage, an unclear pinch-off voltage, tendency of being normally-on easily, or the like. Further, the film has restrictions on production processes or operating environments due to difficulty in wet etching caused by poor chemical resistance.

As for an oxide semiconductor film containing a crystalline substance composed mainly of zinc oxide, film formation is required to be conducted at a high pressure in order to improve performance such as mobility. Therefore, the film deposition rate is low. Further, since a heat treatment at a high temperature of 700° C. or more is required, industrialization is difficult.

In addition, in the case of a TFT using an oxide semiconductor film containing a crystalline substance composed zinc oxide, TFT performance such as mobility is low in the case of a bottom-gate configuration. In order to improve performance, it is required to increase the film thickness to 100 nm or more in a top-gate configuration. Accordingly, the film also has a restriction on device configuration of a TFT.

In order to solve these problems, application of an amorphous oxide semiconductor film comprising indium oxide, gallium oxide and zinc oxide to thin film transistor is studied. In addition, studies are made on forming an amorphous oxide semiconductor film composed of indium oxide, gallium oxide and zinc oxide is formed by a sputtering method, which is a method that enables effective mass production on the industrial basis. Gallium is a rare metal and expensive, and use thereof leads to an increase in a raw material cost. However, if gallium is added in a small amount, a normally-off operation of a TFT cannot be realized as long as the oxygen partial pressure at the time of film formation is not increased.

On the other hand, a thin film transistor obtained by using an amorphous oxide semiconductor film which does not contain gallium and comprises indium oxide and zinc oxide is proposed (Patent Document 1 and Non-Patent Document 1). However, as mentioned above, as long as the oxygen partial pressure at the time of film formation is not increased, a normally-off operation of a TFT cannot be realized.

In addition, a sputtering target for use as a protecting layer of a light information storage medium obtained by adding elements such as Ta, Y and Si to an $In_2O_3$—$SnO_2$—ZnO-based oxide which is composed mainly of tin oxide is studied (Patent Documents 2 and 3). This sputtering target has problems that it is not for use in an oxide semiconductor and an agglomerate of an insulating material tends to be formed easily, and hence, a resistance value is increased or abnormal discharge tends to occur easily.

RELATED ART DOCUMENTS

Patent Documents

Patent Document 1: Japanese Patent No. 4620046
Patent Document 2: WO2005/078152
Patent Document 3: WO2005/078153

Non-Patent Document

Non-Patent Document 1: Kachirayil J. Saji et al., JOURNAL OF THE ELECTROCHEMICAL SOCIETY, 155 (6), H390-395 (2008)

SUMMARY OF THE INVENTION

An object of the invention is to provide a sputtering target which realizes excellent TO TFT properties without increasing the oxygen partial pressure when an oxide thin film is formed by a sputtering method.

According to the invention, the following sputtering target and the like are provided.

1. A sputtering target comprising indium (In), tin (Sn) and zinc (Zn) and an oxide comprising one or more elements X selected from the following group X, the atomic ratio of the elements satisfying the following formulas (1) to (4):

Group X: Mg, Si, Al, Sc, Ti, Y, Zr, Hf, Ta, La, Nd, Sm $$0.10 \leq In/(In+Sn+Zn) \leq 0.85 \quad (1)$$

$$0.01 \leq Sn/(In+Sn+Zn) \leq 0.40 \quad (2)$$

$$0.10 \leq Zn/(In+Sn+Zn) \leq 0.70 \quad (3)$$

$$0.70 \leq In/(In+X) \leq 0.99 \quad (4)$$

2. The sputtering target according to 1, wherein the maximum peak intensity ($I_{(In2O3)}$) of a bixbyite structure compound represented by $In_2O_3$ contained in the sputtering target and the maximum peak intensity ($I_x$) of a compound comprising the element X and oxygen in the X-ray diffraction analysis (XRD) satisfy the following formula (5):

$$I_x/I_{(In2O3)} \leq 0.15 \quad (5).$$

3. The sputtering target according to 1, wherein the maximum peak intensity ($I_{(Zn2SnO4)}$) of a spinel structure compound represented by $Zn_2SnO_4$ contained in the sputtering target and the maximum peak intensity ($I_x$) of a compound comprising the element X and oxygen in the X-ray diffraction analysis (XRD) satisfy the following formula (6):

$$I_x/I_{(Zn2SnO4)} \leq 0.15 \quad (6).$$

4. The sputtering target according to any of 1 to 3, wherein the average crystal particle diameter of the compound comprising the element X and oxygen is 10 μm or less.

5. The sputtering target according to any of 1 to 4, wherein, in the sputtering target, the L*a*b* color difference (ΔE*) measured by CIE 1976 space between a target surface after sintered surface is removed and a part which is ground by 2 mm from the target surface by means of a surface grinding machine is 3.0 or less.

6. The sputtering target according to any of 1 to 5, which has a resistance of 30 mΩcm or less and a relative density of 90% or more.

7. The sputtering target according to any of 1 to 6, wherein the element X is Zr.

8. A method for producing the sputtering target according to any of 1 to 7, comprising:

the step A of mixing and pulverizing indium oxide powder and an oxide of element X;

the step B of subjecting the mixture powder obtained in the step A to calcination at 700 to 1200° C.; and the step C of adding tin oxide powder and zinc oxide powder to the calcined powder obtained in the step B and mixing and pulverizing.

9. An oxide thin film produced by using the sputtering target according to any of 1 to 7.

10. A thin film transistor using the oxide thin film according to 9.

According to the invention, when an oxide thin film such as an oxide semiconductor and a transparent conductive film is formed by a sputtering method, an oxygen partial pressure is not required to be increased, and a sputtering target in which an agglomerate is hardly formed and occurrence of abnormal discharge is suppressed can be obtained.

BRIEF DESCRIPTION OF THE DRAWINGS

FIG. 1 is an X-ray chart of a sputtering target obtained in Example 1.

MODE FOR CARRYING OUT THE INVENTION

The sputtering target of the invention comprises an oxide comprising indium (In), tin (Sn) and zinc (Zn) and one or more elements X selected from the group (hereinafter referred to as the "group X") consisting of Mg, Si, Al, Sc, Ti, Y, Zr, Hf, Ta, La, Nd and Sm, wherein the atomic ratio of the elements satisfies the following formulas (1) to (4):

$$0.10 \leq In/(In+Sn+Zn) \leq 0.85 \quad (1)$$

$$0.01 \leq Sn/(In+Sn+Zn) \leq 0.40 \quad (2)$$

$$0.10 \leq Zn/(In+Sn+Zn) \leq 0.70 \quad (3)$$

$$0.70 \leq In/(In+X) \leq 0.99 \quad (4)$$

Due to the presence of one or more elements X selected from the group X in the sputtering target, an oxygen partial pressure at the time of sputtering can be low.

Of the elements of the above-mentioned group X, one which can form a composite oxide with In, Sn or Zn is preferable. In the case of an element that does not form a composite oxide, an element of which the solid solubility into an In-containing oxide is large is preferable. Solid solution in an In-containing oxide tends to occur easily when the difference in ionic radius between indium and element X is small. Further, it is preferred that the difference in electronegativity between element X and oxygen be larger than the difference in electronegativity between In, Sn and Zn elements and oxygen. In this case, an oxide of element X becomes an oxide having a significantly strong ion bonding property, and hence, an oxygen partial pressure at the time of sputtering can be lowered.

As for the group X, the element is not limited to Mg, Si, Al, Sc, Ti, Y, Zr, Hf, Ta, La, Nd and Sm as long as if the difference in electronegativity between the element X and oxygen is larger than the difference in electronegativity between the In, Sn and Zn elements and oxygen, since similar advantageous effects can be obtained.

Of the elements of the group X, Mg, Si, Al, Sc, Zr and Hf are preferable, with Al, Zr and Hf being particularly preferable.

In the sputtering target of the invention, the amount of In relative to the total of In, Sn and Zn (atomic ratio) in the target [In/(In+Sn+Zn)] satisfies the relationship represented by the following formula (1):

$$0.10 \leq In/(In+Sn+Zn) \leq 0.85 \quad (1)$$

In the formula (1), if the amount of In is smaller than 0.10, the bulk resistance of the sputtering target becomes high, and, as a result, DC sputtering becomes impossible.

On the other hand, if the amount of In is larger than 0.85, effects of lowering the oxygen partial pressure during sputtering by addition of element X cannot be obtained, whereby it becomes difficult to form an oxygen thin film having excellent TFT properties. In addition, due to the small amount of Zn, the resulting film may be amorphous and a stable oxide thin film may not be obtained.

The amount of In [In/(In+Sn+Zn)] is preferably 0.20 to 0.75, further preferably 0.30 to 0.60.

In the sputtering target of the invention, the amount of Sn relative to the total of In, Sn and Zn (atomic ratio) in the target [Sn/(In+Sn+Zn)] satisfies the relationship represented by the following formula (2):

$$0.01 \leq Sn/(In+Sn+Zn) \leq 0.40 \quad (2)$$

In the formula (2), if the amount of Sn is smaller than 0.01, the sintered body density may not be increased sufficiently, and the bulk resistance of the target may be increased.

If the amount of Sn is larger than 0.4, solubility of the resulting thin film in a wet etchant is lowered, leading to difficulty in conducting wet etching.

The amount of Sn [Sn/(In+Sn+Zn)] is preferably 0.05 to 0.30, and further preferably 0.10 to 0.20.

The amount of Zn relative to the total of In, Sn and Zn (atomic ratio) in the target [Zn/(In+Sn+Zn)] satisfies the relationship represented by the following formula (3):

$$0.10 \leq Zn/(In+Sn+Zn) \leq 0.70 \quad (3)$$

In the formula (3), if the amount of Zn is smaller than 0.10, the resulting film may not be stable as an amorphous film. On the other hand, if the amount of Zn is larger than 0.70, the dissolution speed of the resulting thin film in a wet etchant is too high, leading to difficulty in conducting wet etching.

The amount of Zn [Zn/(In+Sn+Zn)] is preferably 0.25 to 0.60, and further preferably 0.40 to 0.50.

In the sputtering target of the invention, the amount of In relative to the total of In and the element X in the target [In/(In+X)] satisfies the relationship represented by the following formula (4):

$$0.70 \leq In/(In+X) \leq 0.99 \quad (4)$$

In the formula (4), if the amount of In is smaller than 0.70, the amount ratio of the element X in the target becomes high, and as a result, an agglomerate of an insulating substance tends to be formed easily, leading to an increased resistance value of the target. Further, during sputtering, abnormal discharge (arcing) is likely to occur.

On the other hand, if the amount of In is larger than 0.99, since the added amount of the element X is small, advantageous effects of addition of the element X cannot be obtained.

The amount of In [In/(In+X)] is preferably 0.80 to 0.99, further preferably 0.85 to 0.99.

When two or more of the element X are added to the sputtering target, the atomic ratio shown by X in the formula (4) means the total of atomic ratios of the elements X added.

In the sputtering target of the invention, it is preferred that the ratio $(I_x/(I_{(In2O3)}))$ of the maximum peak intensity $(I_{(In2O3)})$ of a bixbyite structure compound represented by $In_2O_3$ contained in the sputtering target and the maximum peak intensity $(I_x)$ of a compound comprising the element X and oxygen in the X-ray diffraction analysis (XRD) satisfies the following formula (5):

$$I_x/I_{(In2O3)} \leq 0.15 \quad (5).$$

In the sputtering target of the invention, it is preferred that the ratio $Ix/(I_{(Zn2SnO4)})$ of the maximum peak intensity $(I_{(Zn2SnO4)})$ of a spinel structure compound represented by $Zn_2SnO_4$ and the maximum peak intensity $(I_x)$ of a compound comprising the element X and oxygen in the X-ray diffraction analysis (XRD) satisfy the following formula (6):

$$I_x/I_{(Zn2SnO4)} \leq 0.15 \quad (6).$$

The ratios represented by the above formulas (5) and (6) relatively indicate the amount of a compound comprising the element X and oxygen contained in the sputtering target. Since a compound comprising the element X and oxygen is an insulating substance, if the above-mentioned ratios are larger than 0.15, the bulk resistance of the sputtering target may become high.

The above-mentioned ratios are preferably 0.1 or less, with 0.05 or less being particularly preferable.

The presence of a bixbyite structure compound represented by $In_2O_3$, a spinel structure compound represented by $Zn_2SnO_4$ and a compound comprising the element X and oxygen in the target can be confirmed by an X-ray diffraction (XRD) measurement.

The bixbyite structure compound represented by $In_2O_3$ (or a C-type crystal structure of a rare-earth oxide) also refers to as a C-type rare-earth oxide or $Mn_2O_3$ (I) type oxide. As stated in the "Technology of Transparent Conductive Film" (published by Ohmsha Ltd., edited by Japan Society for the Promotion of Science, transparent oxide/photoelectron material 166 committee, 1999) or the like, this compound has a chemical stoichiometric ratio of $M_2X_3$ (M is a cation and X is an anion, which is normally an oxygen ion), and one unit cell is formed of 16 $M_2X_3$ molecules and total 80 atoms (the number of M is 32 and the number of X is 48).

A substitutional solid solution in which a part of atoms or ions in a crystal structure are replaced by other atoms and an interstitial solid solution in which other atoms are added to a position between lattices are included in a bixbyite structure compound.

Of these, the bixbyite structure compound which is a constituent component of the target of the invention is a compound represented by $In_2O_3$, i.e. a compound showing a peak pattern of No. 06-0416 of JCPDS (Joint Committee on Powder Diffraction Standards) database or showing a similar (shifted) peak pattern in an X-ray diffraction.

As stated in "Crystal Chemistry" (Mitsuoki Nakahira, Kodansha Ltd., 1973) or the like, as for the spinel structure represented by $Zn_2SnO_4$, an $AB_2X_4$ type or $A_2BX_4$ type is normally called a spinel structure, and a compound having such a crystal structure is referred to as a spinel structure compound.

In general, in a spinel structure, a cation (normally, oxygen) is cubic close-packed, and an anion is present in part of the tetrahedral interstitial site or the octahedral interstitial site thereof. A substitutional solid solution in which a part of atoms or ions in a crystal structure are replaced by other atoms and an interstitial solid solution in which other atoms are added to a position between lattices are included in a spinel structure compound.

The spinel structure compound which is a constituent component of the target of the invention is a compound represented by $Zn_2SnO_4$, i.e. a compound showing a peak pattern of No. 24-1470 of JCPDS (Joint Committee on Powder Diffraction Standards) database or showing a similar (shifted) peak pattern in an X-ray diffraction.

As the compound comprising the element X and oxygen, $MgO$, $SiO_2$, $Al_2O_3$, $Sc_2O_3$, $TiO_2$, $Y_2O_3$, $ZrO_2$, $HfO_2$, $Ta_2O_5$, $La_2O_3$, $Nd_2O_3$, $Sm_2O_3$ or the like can be given, for example, i.e, a compound showing a peak pattern of No. 45-0946, 89-1668, 46-1212, 42-1463, 21-1272, 41-1105, 37-1484, 06-0318, 18-1304, 05-0602, 43-1023, 43-1030 of JCPDS (Joint Committee on Powder Diffraction Standards) database or showing a similar (shifted) peak pattern in an X-ray diffraction.

In the sputtering target of the invention, it is preferred that average crystal particle diameter of the compound comprising the element X and oxygen be 10 μm or less. By allowing the average crystal particle diameter to be 10 μm or less, the bulk resistance of the sputtering target can be decreased, whereby occurrence of abnormal discharge can be suppressed, The average crystal particle diameter of the compound comprising the element X and oxygen is preferably 6 μm or less, further preferably 4 μm or less.

The average crystal particle diameter is a value measured by an X-ray nnicroanalyzer (EPMA) For details, an explanation will be given in Examples.

In the sputtering target of the invention, it is preferred that the L*a*b* color difference (ΔE*) measured by CIE 1976 space between a target surface after a sintered surface is removed and a part which is ground by 2 mm from the surface by means of a surface grinding machine be 3.0 or less.

If ΔE* is 3.0 or less, color difference becomes less noticeable by visible observation. In addition, due to in-plane uniformity of sintered body resistance values, effects such as suppression of occurrence of abnormal discharge, improved in-plane uniformity of thin film resistance values or the like can be obtained.

The L*a*b* is a color space based on a xyz colorimetric system, in which L* indicates the brightness, and a* and b* are chromaticity coordinates showing the hue and the chroma together. L* shows only the brightness, irrespective of the color, and the value thereof ranging from L=0 (black) to L=100 (white). A larger L* means that the color is bright and close to white. a* is an axis from red to green and +a* indicates the direction to red and −a* indicates the direction to green. b* is an axis from yellow to blue, and +b* indicates the direction to yellow and −b* indicates the direction to blue.

It is preferred that the sputtering target of the invention have a resistance of 30 mΩcm or less, more preferably 10 mΩcm or less and particularly preferably 5 mΩcm or less. By allowing the resistance to be 30 mΩcm or less, DC sputtering becomes possible, whereby the uniformity and the reproducibility of the TFT properties of the resulting thin film transistor can be improved.

The specific resistance value of the sputtering target means a bulk resistance measured by the four probe method (JIS R 1637).

The sputtering target of the invention has a relative density of preferably 90% or more, further preferably 95% or more, with 98% or more being particularly preferable. If the relative density is less than 90%, the target may be broken during film formation and the film deposition rate may be low.

The relative density is obtained by dividing the actually measured target density value by a theoretical density value.

In the invention, within a range that does not impair the effects of the invention, other metal elements than In, Sn, Zn and the element X mentioned above may be included. However, in the invention, the metal element contained in an oxide sintered body may substantially comprise only In, Sn, Zn and the element X or may comprise only In, Sn, Zn and the element X. In the invention, the "substantially" means that the effects as the sputtering target are derived from In, Sn, Zn and the element X mentioned above or that 95 wt % or more and 100 wt % or less (preferably 98 wt % or more and 100 wt % or less) of the metal element of the sputtering target is In, Sn, Zn and the element X. As mentioned above, the metal element contained in the sputtering target of the invention substantially comprises In, Sn, Zn and the element X, and in an amount range which does not impair the advantageous effects of the invention, other impurities which have been inevitably mixed in may also be contained.

The sputtering target of the invention can be produced by a method in which the oxide raw materials are mixed and pulverized, the resulting powder is formed under pressure, and sintered. The sputtering target of the invention is preferably produced by forming and sintering the raw material prepared in the following steps A to C.

Step A: mixing and pulverizing indium oxide powder and an oxide of element X

Step B: subjecting the mixture powder obtained in the step A to a calcination at 700 to 1200° C.

Step C: adding tin oxide powder and zinc oxide powder to the calcined powder obtained in the step B and mixing and pulverizing In the step A, indium oxide powder and an oxide of the element X are mixed and pulverized. By this, it is possible to allow the elements X to be dispersed uniformly around $In_2O_3$, whereby the reactivity of indium oxide with added elements can be improved.

No particular restrictions are imposed on the indium oxide powder as a raw material and commercially available powder can be used. However, indium oxide powder with a high purity, for example, one having a purity of 4N (0.9999) or more is preferable.

As the oxide of the element X, MgO, $SiO_2$, $Al_2O_3$, $Sc_2O_3$, $TiO_2$, $Y_2O_3$, $ZrO_2$, $HfO_2$, $Ta_2O_5$, $La_2O_3$, $Nd_2O_3$, $Sm_2O_3$ or the like can be given, for example.

As for the means for mixing and pulverizing, a known apparatus such as a ball mill, a beads mill, a planetary ball mill, a jet mill and a ultrasonic apparatus can be used.

Conditions such as the time for mixing and pulverizing may be adjusted appropriately. If a wet ball mill is used, mixing and pulverization is preferably conducted for about 6 to 100 hours. If mixing and pulverizing is conducted for 6 hours or shorter, indium oxide powder and an oxide of the element X may not be dispersed fully homogenously. On the other hand, a mixing and pulverizing time exceeding 100 hours cannot be put into practical use since the production cost is increased due to a too long production time.

When indium oxide powder and an oxide of the element X are mixed and pulverized, it is preferred that the mixture after the pulverization have an average particle diameter of normally 10 μm or less, preferably 3 μm or less, and particular preferably 1 μm or less. If the average particle diameter of the powder mixture is too large, the reactivity of the indium oxide powder with an oxide of the element X is lowered, and as a result, an agglomerate of an insulating substance tends to be formed easily.

The average particle size after mixing and pulverizing is a volume average particle diameter measured by a method described in JIS R 1629.

In the step B, the powder mixture obtained in the step A is subjected to calcination at 700 to 1200° C. By subjecting the powder mixture to calcination at 700 to 1200° C., the element X is substituted in the In site of $In_2O_3$ to the solubility limit, whereby agglomeration of the added elements can be suppressed.

The calcination temperature is preferably 800 to 1100° C., further preferably 900 to 1000° C. For the calcination, a common firing furnace or the like can be used.

The calcination time is about 1 to 100 hours, preferably 3 to 50 hours.

If calcination is conducted at less than 700° C. or for shorter than 1 hour, reaction of indium oxide powder and an oxide of the element X may be insufficient. On the other hand, if calcination is conducted at a temperature exceeding 1200° C. or for longer than 100 hours, coarsening of the particles may occur, and the particles may not be mixed fully homogeneously in the subsequent mixing and pulverizing step.

No specific restrictions are imposed on the atmosphere of calcination as long as it is an oxidizing atmosphere. For example, the calcination may be conducted in the air. It is more preferred that the calcination be conducted in an oxygen gas atmosphere or under an oxygen gas pressure.

After the calcination, if need arises, the treated product may be sieved or pulverized. The means for pulverization is not particularly restricted, and a known means such as various mills can be used.

In the step C, to the calcined powder obtained in the step B, tin oxide powder and zinc oxide power are added, and mixed and pulverized. As a result, agglomeration of the element X during sintering of the raw material powder can be suppressed, whereby unevenness in color of the target can be minimized.

No particular restrictions are imposed on the tin oxide powder and zinc oxide powder as raw materials, and commercially available powder can be used. However, tin oxide powder and zinc oxide powder with a high purity, for example, one having a purity of 4N (0.9999) or more is preferable.

In the invention, by allowing the element X to be in the solid solution state with the indium oxide powder, the possibility that the oxide powder of the element X is adhered with one another is decreased. As a result, generation of an agglomerate composed mainly of the element X in the target can be suppressed.

The reason for selecting indium oxide powder, not tin oxide powder or zinc oxide in the step A, is that, since the element X tends to be in the solid-solution state with an In-based compound easily, and zinc oxide tends to sublime, the charged amount of the raw materials and the atomic composition in calcined product may be changed.

By forming the raw material prepared in steps A to C by a known method, followed by sintering, an oxide sintered body is obtained.

In the forming step, for example, the powder mixture obtained in the step C is subjected to pressure molding to obtain a formed body. In this step, the powder mixture is formed into a shape of a product (for example, a shape preferable as a target).

As the forming process, metallic molding, casting, injection molding or the like can be given. In order to obtain a sintered body (target) having a high sintering density, it is preferable to conduct forming by cold isostatic pressing (CIP) or the like.

In the forming, a forming aid such as polyvinyl alcohol, methyl cellulose, polywax, and oleic acid may be used.

The sintering step is an essential step in which the formed product obtained in the forming step is sintering.

As for sintering conditions, a shaped body is sintered in an oxygen gas atmosphere or under oxygen gas pressure normally at 1200 to 1550° C. for normally 30 minutes to 360 hours, preferably 8 to 180 hours, more preferably 12 to 96 hours. If the sintering temperature is less than 1200° C., the density of the target may be hard to be increased or a too long period of time may be spent for sintering. On the other hand, if the sintering temperature exceeds 1550° C., due to vaporization of components, the composition may be varied or the furnace may be damaged.

If the sintering time is less than 30 minutes, the density of the target may not be increased easily, and if the sintering time is longer than 360 hours, the production time becomes too long to increase the cost, and hence, such a long sintering time cannot be put into practical use. Within the above-mentioned range, the relative density can be improved and the bulk resistance can be lowered.

The heating rate at the time of sintering is normally 8° C./min or less, preferably 4° C./min or less, more preferably 3° C./or less, and further preferably 2° C./min or less. If the heating rate is 8° C./min or less, cracks hardly generate.

The cooling rate at the time of sintering is normally 4° C./min or less, preferably 2° C./min or less, more preferably 1° C./min or less, further preferably 0.8° C./min or less, and particularly preferably 0.5° C./min or less. If the cooling rate is 4° C./min or less, cracks are hardly generated.

As for heating and cooling, the temperature can be changed in a stepwise manner.

By processing the oxide sintered body into a desired shape according to need, a sputtering target can be obtained.

Processing is conducted in order to out the oxide sintered body into a shape suited to installation in a sputtering apparatus and in order to install a mounting jig such as a backing plate. In order to allow the oxide sintered body to be a sputtering target, the sintered body is ground by a surface grinding machine, for example, to allow the surface roughness (Ra) to be 5 µm. It is further preferable to subject the sputtering surface of the sputtering target to mirror finishing, thereby to allow the surface roughness (Ra) to be 1000 Å or less. If the surface is smooth, particles generated at the initial stage of film formation by sputtering can be decreased.

It is preferable to conduct grinding by 0.1 mm or more, more preferably 0.3 mm or more, further preferably 0.5 mm or more and particularly preferably 1 mm or more. By grinding by 0.1 mm or more, a part in the vicinity of the surface in which the composition is varied due to the sublimation of components such as zinc can be removed.

The resulting sputtering target is bonded to a backing plate. The thickness of the target is normally 2 to 20 mm, preferably 3 to 12 mm, and particularly preferably 4 to 10 mm. A plurality of targets may be mounted in a single backing plate to obtain a substantially single target.

By sputtering an object such as a substrate by using the sputtering target of the invention, the oxide thin film of the invention can be formed. By using the sputtering target of the invention, it is possible to suppress the oxygen partial pressure at the time of film formation, whereby film deposition rate and productivity can be improved.

For example, although the oxygen partial pressure at the time of sputtering is normally about 10 to 100%, in the present invention, the oxygen partial pressure can be about 1 to 5%.

The oxide thin film of the invention can be used for a transparent electrode, a semiconductor layer of a thin film transistor, an oxide thin film or the like. In particular, the oxide thin film can be preferably used as a semiconductor layer of a thin film transistor.

EXAMPLES

The invention will be explained in more detail with reference to Examples below. However the invention is not limited to the following Examples without departing from the scope of the invention.

Example 1

(1) Preparation of Raw Materials

As a raw material, indium oxide powder (manufactured by Nippon Rare Metal, Inc., average particle size: 1 µm or less, purity: rank as 4N) and hafnium oxide powder (manufactured by Wako Pure Chemical Industries, Ltd., average particle size: 1 µm or less, purity: rank as 4N) were used. These were mixed such that the atomic ratio of the element In to the total amount of the element In and the element Hf [In/(In+Hf)] became 0.88. The mixture was supplied to a wet type ball mill and mixed and pulverized for 12 hours.

The mixed slurry obtained was taken out, and filtrated and dried. The resulting dry powder was filled in a firing furnace, and calcined at 1000° C. for 5 hours in atmospheric air.

As a result, mixed powder containing the element In and the element Hf was obtained.

To the mixed powder, tin oxide powder (Kojundo Chemical Laboratory Co., Ltd., average particle size: 1 μm or less, purity: rank as 4N) and zinc oxide powder (Kojundo Chemical Laboratory Co., Ltd., average particle size: 1 μm or less, purity: rank as 4N) were mixed such that the atomic ratio [Sn/(In+Sn+Zn)] became 0.11 and the atomic ratio [Zn/(In+Sn+Zn)] became 0.53. The mixture powder was supplied to a wet type ball mill and mixed and pulverized for 24 hours to obtain slurry of the raw material fine powders. The slurry was filtrated, dried and granulated.

(2) Production of a Sputtering Target

The granulated product obtained in (1) mentioned above was subjected to pressure molding, and then formed by cold isostatic pressing under a pressure of 2000 kgf/cm$^2$.

The resulting shaped body was mounted in a firing furnace, and sintered at 1400° C. for 12 hours in atmospheric pressure under a flow of oxygen gas to obtain a sintered body. The heating rate was 0.5° C./min from room temperature to 400° C. and 1° C./min from 400 to 1400° C. The cooling rate was 1° C./min.

After the sides of the sintered body obtained were cut by means of a diamond cutter, the upper and lower surfaces of the sintered body were ground by means of a surface grinder to obtain a sputtering target having a diameter of 2 inch, a thickness of 5 mm and a surface roughness (Ra) of 0.5 μm or less.

The resulting sputtering target was evaluated according to the following method for the elementary composition ratio, the bulk resistance (mΩcm), the relative density, the intensity ratio of maximum peak at X-ray diffraction (XRD) [$I_x/I_{(In2O3)}$], [$I_x/I_{(Zn2SnO4)}$], the average crystal particle size of an oxide composed of the element X and oxygen, the color difference ΔE*, the abnormal discharge and the necessary oxygen partial pressure at film-formation.

The results are shown in Table 1.

(A) Elementary Composition Ratio (Atomic Ratio)

The elementary composition ratio was measured by the Inductively Coupled Plasma Atomic Emission Spectroscopy (ICP-AES).

(B) Bulk Resistance of a Sputtering Target

The bulk resistance was measured in an arbitrary ten areas by a four-probe method (JIS R 1637) using a resistance meter ("Loresta" manufactured by Mitsubishi Chemical Corporation), and the average value was taken as the bulk resistance of the sintered body.

(C) Relative Density

The relative density was measured by the following formula based on the theoretical density calculated from the density of the raw material powder and the density of the sintered body measured by the Archimedian method.

Relative density=(Density measured by the Archimedes method)/(Theoretical density)×100 (%)

(D) X-ray Diffraction Measurement

The X-ray diffraction measurement was conducted using the following apparatus and conditions.
Apparatus: "Ultima-III" manufactured by Rigaku Corporation
X-rays: Cu-Kα radiation (wavelength: 1.5406 Å, monochromatized using a graphite monochromator)
2θ-θ reflection method, continuous scan (1.0°/min)
Sampling interval: 0.02°
Slit DS, SS: ⅔°, RS: 0.6 mm The X-ray chart of the sputtering target obtained in Example 1 is shown in FIG. 1

(E) Average Crystal Particle Size

The sintered body was buried in a resin. The surface of the sintered body was polished using alumina particles (particle size: 0.05 μm), and observed using an X-ray microanalyzer (EPMA) ("JXA-8621MX" manufactured by JEOL Ltd.) (magnification: ×1000). The surface of the sintered body was observed in arbitrary selected three locations each being a square having a size of 100 μm×100 μm. In each square, the maximum diameter of crystal particles composed of an added element X and oxygen was measured. The maximum diameter thus obtained was taken as the average crystal particle size.

(F) Color Difference ΔE*

The surface part of the ground sintered body and the part obtained by grinding the surface of the sintered body by 2 mm using a surface grinder were measured by means of a spectrophotometer NR11A (manufactured by NIPPON DENSHOKU INDUSTRIES CO., LTD.), and evaluated in CIE1976 space. The hue was measured for arbitral five points, and the measured values were averaged to obtain the reference value.

$$\Delta E^* = \sqrt{(\Delta L^{*2} + \Delta a^{*2} + \Delta b^{*2})}$$

(G) Abnormal Discharge

A sputtering target was mounted in a DC magnetron sputtering apparatus, and occurrence of abnormal discharge during the continuous sputtering for 96 hours under the conditions of $O_2 \times 100$ $(Ar+O_2)=3\%$ was observed.

In the case where no abnormal discharge was observed, the target was evaluated as "○". In the case where abnormal discharge occurred, the target was evaluated as "x"

(H) Necessary Oxygen Partial Pressure

The sputtering target fabricated was mounted in a DC magnetron sputtering apparatus. A top contact bottom gate type TFT was fabricated according to the following method. The oxygen partial pressure ($O_2/(Ar+O_2)$) at the time of forming a channel layer was evaluated.

In the tables, the evaluation "-" means that a channel layer could not be formed since DC charge was impossible.

(1) Production of a TFT

As a substrate, an n-type highly doped silicone substrate with a thermally-oxidized film was used. The substrate and the thermally-oxidized film (100 nm) served as a gate electrode and a gate insulator film, respectively.

After a mask was set on the silicone substrate for forming a channel layer, a 50 nm-thick amorphous film was formed using a sputtering target by DC sputtering in a flow of Ar gas and $O_2$ gas.

Next, a mask was set for formation of source and drain electrodes, and an Au film was formed by RF sputtering to obtain source and drain electrodes.

Subsequently, a heat treatment was conducted in atmospheric air at 300° C. for 60 minutes to obtain a TFT with a channel length of 200 μm and a channel width of 1000 μm.

(2) Measurement of a Necessary Oxygen Concentration

The oxygen concentration at the time of formation of a channel layer ($O_2/(Ar+O_2)$) was measured. The smallest oxygen partial pressure necessary for obtaining predetermined TFT characteristics (specifically, Vth≥−0.5V and the mobility (electron field-effect mobility (μ))≥5 cm$^2$/Vs) was taken as the necessary oxygen concentration.

The TFT characteristics were evaluated using a semiconductor parameter analyzer (KEITHLEY 4200) at room temperature under light shielding environment while spraying nitrogen at the conditions of a drain voltage (Vds) of 5V and a gate voltage (Vgs) of −20 to 20 V.

Examples 2 to 25

Sputtering targets were produced and evaluated in the same manner as in Example 1, except that in preparation of raw materials, the composition of the raw materials and the oxide of the element X were changed as shown in Table 1 or 2. The results are shown in Tables 1 to 3.

All oxides of the element X are manufactured by Wako Pure Chemical Industries, Ltd.

Example 26

A sputtering target was produced and evaluated in the same manner as in Example 1, except that in preparation of raw materials, the composition of the raw materials and the oxide of the element X were changed as shown in Table 3 and the mixing was conducted for 6 hours using a planetary ball mill.

Comparative Examples 1 to 5

(1) Preparation of Raw Materials

Indium oxide, zinc oxide and tin oxide were blended as shown in Table 4 and mixed. The resulting mixture was supplied in a wet type ball mill, and then mixed and pulverized for 12 hours to obtain slurry of raw material fine powders. The slurry was filtrated, dried and granulated.

(2) Production of a Sputtering Target

Sputtering targets were produced and evaluated in the same manner as in Example 1. The results are shown in Table 4.

Comparative Examples 6 to 10

Sputtering targets were produced and evaluated in the same manner as in Example 1, except that in preparation of raw materials, the composition of the raw materials and the oxide of the element X were changed as shown in Table 4. The results are shown in Table 4.

Comparative Example 11

(1) Preparation of Raw Materials

As a raw material, indium oxide, tin oxide and zinc oxide which are the same as those in Example 1 and tantalum oxide which is the as in Example 19 were used. These were mixed such that the atomic ratio [In/(In+Ta)] became 0.51, the atomic ratio [In/(In+Sn+Zn)] became 0.50, the atomic ratio [Sn/(In+Sn+Zn)] became 0.14 and the atomic ratio [Zn/(In+Sn+Zn)] became 0.36. The mixture was supplied to a wet type ball mill and mixed and pulverized for 12 hours to obtain slurry of raw material fine powders. The slurry was filtrated, dried and granulated.

(2) Production of a Sputtering Target

A sputtering target was produced and evaluated in the same manner as in Example 1. The results are shown in Table 5.

Comparative Examples 12 to 20

Sputtering targets were produced and evaluated in the same manner as in Comparative Example 11, except that the raw material compositions were changed as shown in Table 5. The results are shown in Table 5.

TABLE 1

| | | Examples | | | | | | | | | |
|---|---|---|---|---|---|---|---|---|---|---|---|
| | | 1 | 2 | 3 | 4 | 5 | 6 | 7 | 8 | 9 | 10 |
| Oxide of element X | | $HfO_2$ | $HfO_2$ | $ZrO_2$ | $HfO_2$ | $Al_2O_3$ | $HfO_2$ | $ZrO_2$ | $ZrO_2$ | $Al_2O_3$ | $HfO_2$ |
| Composition ratio of raw materials (atomic ratio) | In/(In + X) | 0.88 | 0.91 | 0.95 | 0.91 | 0.93 | 0.88 | 0.92 | 0.91 | 0.86 | 0.80 |
| | In/(In + Sn + Zn) | 0.36 | 0.53 | 0.38 | 0.52 | 0.39 | 0.37 | 0.63 | 0.52 | 0.32 | 0.44 |
| | Sn/(In + Sn + Zn) | 0.11 | 0.05 | 0.15 | 0.11 | 0.15 | 0.05 | 0.16 | 0.11 | 0.26 | 0.28 |
| | Zn/(In + Sn + Zn) | 0.53 | 0.42 | 0.47 | 0.37 | 0.46 | 0.58 | 0.21 | 0.37 | 0.42 | 0.28 |
| Preparation method of raw materials | | A | A | A | A | A | A | A | A | A | A |
| Composition ratio of target (atomic ratio) | In/(In + X) | 0.88 | 0.91 | 0.95 | 0.91 | 0.93 | 0.88 | 0.92 | 0.91 | 0.86 | 0.80 |
| | In/(In + Sn + Zn) | 0.36 | 0.53 | 0.38 | 0.52 | 0.39 | 0.37 | 0.63 | 0.52 | 0.32 | 0.44 |
| | Sn/(In + Sn + Zn) | 0.11 | 0.05 | 0.15 | 0.11 | 0.15 | 0.05 | 0.16 | 0.11 | 0.26 | 0.28 |
| | Zn/(In + Sn + Zn) | 0.53 | 0.42 | 0.47 | 0.37 | 0.46 | 0.58 | 0.21 | 0.37 | 0.42 | 0.28 |
| Evaluation of target | Bulk resistance (mΩcm) | 3 | 8 | 12 | 5 | 4 | 4 | 2 | 3 | 10 | 7 |
| | Relative density (%) | 96 | 97 | 98 | 98 | 98 | 98 | 98 | 98 | 98 | 96 |
| | Intensity ratio Ix/I(In2O3) | Less than 0.1 | Less than 0.1 | Less than 0.1 | Less than 0.1 | Less than 0.1 | Less than 0.1 | Less than 0.1 | Less than 0.1 | Less than 0.1 | Less than 0.1 |
| | Intensity ratio Ix/I(Zn2SnO4) | Less than 0.1 | Less than 0.1 | Less than 0.1 | Less than 0.1 | Less than 0.1 | Less than 0.1 | Less than 0.1 | Less than 0.1 | Less than 0.1 | Less than 0.1 |
| | Average crystal particle (μm) | 6 | 6 | Less than 1 | 5 | 1 | 6 | 6 | 3 | Less than 1 | 8 |
| | Color difference ΔE* | 0.4 | 0.8 | 1.2 | 1.0 | 0.3 | 1.8 | 1.4 | 0.6 | 1.3 | 0.9 |
| | DC discharge | Possible | Possible | Possible | Possible | Possible | Possible | Possible | Possible | Possible | Possible |
| | Abnormal discharge | ◯ | ◯ | ◯ | ◯ | ◯ | ◯ | ◯ | ◯ | ◯ | ◯ |
| | Necessary oxygen partial pressure (%) | 3 | 3 | 3 | 3 | 3 | 3 | 3 | 3 | 3 | 3 |

Method for preparing raw materials A: Indium oxide and an oxide of element X are heat-treated, followed by addition of tin oxide and zinc oxide.

TABLE 2

| | | Examples | | | | | | | | | |
|---|---|---|---|---|---|---|---|---|---|---|---|
| | | 11 | 12 | 13 | 14 | 15 | 16 | 17 | 18 | 19 | 20 |
| Oxide of element X | | $Al_2O_3$ | $Sc_2O_3$ | $Sm_2O_3$ | $Nd_2O_3$ | $La_2O_3$ | $Sc_2O_3$ | $TiO_2$ | $Y_2O_3$ | $Ta_2O_5$ | $Sc_2O_3$ |
| Composition ratio of raw materials (atomic ratio) | In/(In + X) | 0.91 | 0.82 | 0.92 | 0.92 | 0.92 | 0.92 | 0.92 | 0.92 | 0.92 | 0.93 |
| | In/(In + Sn + Zn) | 0.21 | 0.50 | 0.58 | 0.58 | 0.58 | 0.58 | 0.58 | 0.58 | 0.58 | 0.39 |
| | Sn/(In + Sn + Zn) | 0.20 | 0.22 | 0.16 | 0.16 | 0.16 | 0.16 | 0.16 | 0.16 | 0.16 | 0.15 |
| | Zn/(In + Sn + Zn) | 0.59 | 0.28 | 0.26 | 0.26 | 0.26 | 0.26 | 0.26 | 0.26 | 0.26 | 0.46 |
| Preparation method of raw materials | | A | A | A | A | A | A | A | A | A | A |
| Composition ratio of target (atomic ratio) | In/(In + X) | 0.91 | 0.82 | 0.92 | 0.92 | 0.92 | 0.92 | 0.92 | 0.92 | 0.92 | 0.93 |
| | In/(In + Sn + Zn) | 0.21 | 0.50 | 0.58 | 0.58 | 0.58 | 0.58 | 0.58 | 0.58 | 0.58 | 0.39 |
| | Sn/(In + Sn + Zn) | 0.20 | 0.22 | 0.16 | 0.16 | 0.16 | 0.16 | 0.16 | 0.16 | 0.16 | 0.15 |
| | Zn/(In + Sn + Zn) | 0.59 | 0.28 | 0.26 | 0.26 | 0.26 | 0.26 | 0.26 | 0.26 | 0.26 | 0.46 |
| Evaluation of target | Bulk resistance (mΩcm) | 6 | 8 | 15 | 10 | 8 | 9 | 12 | 7 | 11 | 14 |
| | Relative density (%) | 98 | 97 | 95 | 96 | 97 | 99 | 96 | 97 | 97 | 98 |
| | Intensity ratio Ix/I(In2O3) | Less than 0.1 | Less than 0.1 | Less than 0.1 | Less than 0.1 | Less than 0.1 | Less than 0.1 | Less than 0.1 | Less than 0.1 | Less than 0.1 | Less than 0.1 |
| | Intensity ratio Ix/I(Zn2SnO4) | Less than 0.1 | Less than 0.1 | Less than 0.1 | Less than 0.1 | Less than 0.1 | Less than 0.1 | Less than 0.1 | Less than 0.1 | Less than 0.1 | Less than 0.1 |
| | Average crystal particle (μm) | Less than 1 | 6 | 8 | 4 | 7 | 6 | Less than 1 | 8 | 4 | 7 |
| | Color difference ΔE* | 1.0 | 0.7 | 1.4 | 1.2 | 0.8 | 0.9 | 1.3 | 0.6 | 0.4 | 0.8 |
| | DC discharge | Possible | Possible | Possible | Possible | Possible | Possible | Possible | Possible | Possible | Possible |
| | Abnormal discharge | ○ | ○ | ○ | ○ | ○ | ○ | ○ | ○ | ○ | ○ |
| | Necessary oxygen partial pressure (%) | 3 | 3 | 3 | 3 | 3 | 3 | 3 | 3 | 3 | 3 |

Method for preparing raw materials A: Indium oxide and an oxide of element X are heat-treated, followed by addition of tin oxide and zinc oxide.

TABLE 3

| | | Examples | | | | | |
|---|---|---|---|---|---|---|---|
| | | 21 | 22 | 23 | 24 | 25 | 26 |
| Oxide of element X | | $SiO_2$ | $SiO_2$ | $SiO_2$ | MgO | MgO | $Al_2O_3$ |
| Composition ratio of raw materials (atomic ratio) | In/(In + X) | 0.93 | 0.92 | 0.88 | 0.93 | 0.92 | 0.79 |
| | In/(In + Sn + Zn) | 0.39 | 0.63 | 0.37 | 0.39 | 0.63 | 0.41 |
| | Sn/(In + Sn + Zn) | 0.15 | 0.16 | 0.47 | 0.15 | 0.16 | 0.16 |
| | Zn/(In + Sn + Zn) | 0.46 | 0.21 | 0.16 | 0.46 | 0.21 | 0.43 |
| Preparation method of raw materials | | A | A | A | A | A | B |
| Composition ratio of target (atomic ratio) | In/(In + X) | 0.93 | 0.92 | 0.88 | 0.93 | 0.92 | 0.79 |
| | In/(In + Sn + zn) | 0.38 | 0.63 | 0.37 | 0.38 | 0.63 | 0.41 |
| | Sn/(In + Sn + Zn) | 0.15 | 0.16 | 0.47 | 0.15 | 0.16 | 0.16 |
| | Zn/(In + Sn + Zn) | 0.46 | 0.21 | 0.16 | 0.46 | 0.21 | 0.43 |
| Evaluation of target | Bulk resistance (mΩcm) | 5 | 7 | 10 | 4 | 6 | 6.75 |
| | Relative density (%) | 97 | 95 | 98 | 97 | 96 | 94% |
| | Intensity ratio Ix/I(In2O3) | Less than 0.1 | Less than 0.1 | Less than 0.1 | Less than 0.1 | Less than 0.1 | Less than 0.1 |
| | Intensity ratio Ix/I(Zn2SnO4) | Less than 0.1 | Less than 0.1 | Less than 0.1 | Less than 0.1 | Less than 0.1 | Less than 0.1 |
| | Average crystal particle (μm) | Less than 1 | Less than 1 | Less than 1 | Less than 1 | Less than 1 | 1 or less |
| | Color difference ΔE* | 0.9 | 1.2 | 0.8 | 1.5 | 1.8 | 0.3 |
| | DC discharge | Possible | Possible | Possible | Possible | Possible | Possible |
| | Abnormal discharge | ○ | ○ | ○ | ○ | ○ | ○ |
| | Necessary oxygen partial pressure (%) | 3 | 3 | 3 | 3 | 3 | 3 |

Method for preparing raw materials A: Indium oxide and an oxide of element X are heat-treated, followed by addition of tin oxide and zinc oxide.
Method for preparing raw materials B: Indium oxide, an oxide of element X, tin oxide and zinc oxide are simultaneously treated.

TABLE 4

| | | Comparative Examples | | | | | | | | | |
|---|---|---|---|---|---|---|---|---|---|---|---|
| | | 1 | 2 | 3 | 4 | 5 | 6 | 7 | 8 | 9 | 10 |
| Oxide of element X | | — | — | — | — | — | $HfO_2$ | $ZrO_2$ | $Sc_2O_3$ | $TiO_2$ | $Y_2O_3$ |
| Composition ratio of raw materials (atomic ratio) | In/(In + X) | — | — | — | — | — | 0.50 | 0.50 | 0.49 | 0.51 | 0.50 |
| | In/(In + Sn + Zn) | 0.35 | 0.46 | 0.55 | 0.64 | 0.75 | 0.50 | 0.49 | 0.50 | 0.50 | 0.50 |
| | Sn/(In + Sn + Zn) | 0.15 | 0.15 | 0.14 | 0.16 | 0.15 | 0.14 | 0.15 | 0.14 | 0.16 | 0.15 |
| | Zn/(In + Sn + Zn) | 0.50 | 0.39 | 0.31 | 0.20 | 0.10 | 0.36 | 0.36 | 0.36 | 0.34 | 0.35 |
| Preparation method of raw materials | | — | — | — | — | — | A | A | A | A | A |

TABLE 4-continued

|  |  | Comparative Examples | | | | | | | | | |
|---|---|---|---|---|---|---|---|---|---|---|---|
|  |  | 1 | 2 | 3 | 4 | 5 | 6 | 7 | 8 | 9 | 10 |
| Composition ratio of target (atomic ratio) | In/(In + X) | — | — | — | — | — | 0.50 | 0.50 | 0.49 | 0.51 | 0.50 |
|  | In/(In + Sn + Zn) | 0.35 | 0.46 | 0.55 | 0.64 | 0.75 | 0.50 | 0.49 | 0.50 | 0.50 | 0.50 |
|  | Sn/(In + Sn + Zn) | 0.15 | 0.15 | 0.14 | 0.16 | 0.15 | 0.14 | 0.15 | 0.14 | 0.16 | 0.15 |
|  | Zn/(In + Sn + Zn) | 0.50 | 0.39 | 0.31 | 0.20 | 0.10 | 0.36 | 0.36 | 0.36 | 0.34 | 0.35 |
| Evaluation of target | Bulk resistance (mΩcm) | 5 | 7 | 10 | 15 | 11 | 3200 | 2700 | 4100 | 2800 | 2900 |
|  | Relative density (%) | 97 | 95 | 94 | 95 | 98 | 82 | 84 | 81 | 79 | 63 |
|  | Intensity ratio Ix/I(In2O3) | — | — | — | — | — | 0.3 | 0.3 | 0.4 | Less than 0.1 | 0.2 |
|  | Intensity ratio Ix/I(Zn2SnO4) | — | — | — | — | — | 0.5 | 0.4 | 0.6 | Less than 0.1 | 0.5 |
|  | Average crystal particle (μm) | — | — | — | — | — | 51 | 46 | 44 | Less than 1 | 38 |
|  | Color difference ΔE* | 0.8 | 1.2 | 0.6 | 2.3 | 1.8 | 2.8 | 8.7 | 3.6 | 2.4 | 4.8 |
|  | DC discharge | Possible | Possible | Possible | Possible | Possible | Impossible | Impossible | Impossible | Impossible | Impossible |
|  | Abnormal discharge | ○ | ○ | ○ | ○ | ○ | — | — | — | — | — |
|  | Necessary oxygen partial pressure (%) | 40 | 50 | 70 | 80 | 100 | — | — | — | — | — |

Method for preparing raw materials A: Indium oxide and an oxide of element X are heat-treated, followed by addition of tin oxide and zinc oxide.
Method for preparing raw materials B: Indium oxide, an oxide of element X, tin oxide and zinc oxide are simultaneously treated.

TABLE 5

|  |  | Comparative Examples | | | | | | | | | |
|---|---|---|---|---|---|---|---|---|---|---|---|
|  |  | 11 | 12 | 13 | 14 | 15 | 16 | 17 | 18 | 19 | 20 |
| Oxide of element X |  | $Ta_2O_5$ | $La_2O_3$ | $Nd_2O_3$ | $Sm_2O_3$ | $Al_2O_3$ | $SiO_2$ | MgO | $HfO_2$ | $ZrO_2$ | $Sc_2O_3$ |
| Composition ratio of raw materials (atomic ratio) | In/(In + X) | 0.51 | 0.48 | 0.50 | 0.50 | 0.50 | 0.48 | 0.51 | 0.64 | 0.66 | 0.65 |
|  | In/(In + Sn + Zn) | 0.50 | 0.50 | 0.50 | 0.50 | 0.50 | 0.50 | 0.50 | 0.50 | 0.49 | 0.51 |
|  | Sn/(In + Sn + Zn) | 0.14 | 0.15 | 0.14 | 0.16 | 0.16 | 0.16 | 0.15 | 0.16 | 0.15 | 0.14 |
|  | Zn/(In + Sn + Zn) | 0.36 | 0.35 | 0.36 | 0.34 | 0.34 | 0.34 | 0.35 | 0.34 | 0.36 | 0.35 |
| Preparation method of raw materials |  | B | B | B | B | B | B | B | B | B | B |
| Composition ratio of target (atomic ratio) | In/(In + X) | 0.51 | 0.48 | 0.50 | 0.50 | 0.50 | 0.48 | 0.51 | 0.64 | 0.66 | 0.65 |
|  | In/(In + Sn + Zn) | 0.50 | 0.50 | 0.50 | 0.50 | 0.50 | 0.50 | 0.50 | 0.50 | 0.49 | 0.51 |
|  | Sn/(In + Sn + Zn) | 0.14 | 0.15 | 0.14 | 0.16 | 0.16 | 0.16 | 0.15 | 0.16 | 0.15 | 0.14 |
|  | Zn/(In + Sn + Zn) | 0.36 | 0.35 | 0.36 | 0.34 | 0.34 | 0.34 | 0.35 | 0.34 | 0.36 | 0.35 |
| Evaluation of target | Bulk resistance (mΩcm) | 3300 | 2600 | 4400 | 5100 | 3200 | 4200 | 3200 | 480 | 370 | 550 |
|  | Relative density (%) | 78 | 79 | 85 | 82 | 75 | 80 | 81 | 87 | 88 | 91 |
|  | Intensity ratio Ix/I(In2O3) | 0.3 | 0.3 | 0.4 | 0.4 | Less than 0.1 | Less than 0.1 | Less than 0.1 | 0.2 | 0.2 | 0.2 |
|  | Intensity ratio Ix/I(Zn2SnO4) | 0.4 | 0.5 | 0.6 | 0.4 | Less than 0.1 | Less than 0.1 | Less than 0.1 | 0.1 | 0.1 | 0.1 |
|  | Average crystal particle (μm) | 46 | 39 | 52 | 47 | Less than 1 | Less than 1 | Less than 1 | 25 | 31 | 22 |
|  | Color difference ΔE* | 7.3 | 3.8 | 5.8 | 4.3 | 2.8 | 3.6 | 5.1 | 2.6 | 3.6 | 2.6 |
|  | DC discharge | Impossible | Impossible | Impossible | Impossible | Impossible | Impossible | Impossible | Possible | Possible | Possible |
|  | Abnormal discharge | — | — | — | — | — | — | — | X | X | X |
|  | Necessary oxygen partial pressure (%) | — | — | — | — | — | — | — | 3 | 3 | 3 |

Method for preparing raw materials B: Indium oxide, an oxide of element X, tin oxide and zinc oxide are simultaneously treated.

INDUSTRIAL APPLICABILITY

The sputtering target of the invention is suitable for fabricating an oxide thin film such as an oxide semiconductor and a transparent conductive film, in particular, for forming an oxide thin film for a thin film transistor. Further, the oxide thin film of the invention can be used as a transparent electrode, a semiconductor layer of a thin film transistor, an oxide thin film layer or the like.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification are incorporated herein by reference in its entirety.

The invention claimed is:

1. A sputtering target comprising indium (In), tin (Sn) and zinc (Zn) and an oxide comprising one or more elements X selected from the following group X,
   an atomic ratio of the elements satisfying the following formulas (1) to (4), wherein
   an average crystal particle diameter of a compound comprising the element X and oxygen is 10 μm or less, and
   a maximum peak intensity ($I_{(Zn2SnO4)}$) of a spinel structure compound represented by $Zn_2SnO_4$ contained in the sputtering target and a maximum peak intensity ($I_x$) of a compound comprising the element X and oxygen in the X-ray diffraction analysis (XRD) satisfy the following formula (6):

Group X: Mg, Si, Al, Sc, Ti, Y, Zr, Hf, Ta, La, Nd, Sm $$0.10 \leq \text{In}/(\text{In}+\text{Sn}+\text{Zn}) \leq 0.85 \tag{1}$$

$$0.01 \leq \text{Sn}/(\text{In}+\text{Sn}+\text{Zn}) \leq 0.40 \tag{2}$$

$$0.10 \leq \text{Zn}/(\text{In}+\text{Sn}+\text{Zn}) \leq 0.70 \tag{3}$$

$$0.70 \leq \text{In}/(\text{In}+\text{X}) \leq 0.99 \tag{4}$$

$$I_x/I_{(Zn2SnO4)} \leq 0.15 \tag{6}$$

2. The sputtering target according to claim 1, wherein a maximum peak intensity ($I_{(In2O3)}$) of a bixbyite structure compound represented by $In_2O_3$ contained in the sputtering target and the maximum peak intensity (10 of a compound comprising the element X and oxygen in the X-ray diffraction analysis (XRD) satisfy the following formula (5):

$$I_x/I_{(In2O3)} \leq 0.15 \tag{5}$$

3. The sputtering target according to claim 1, wherein, in the sputtering target, an L*a*b* color difference (ΔE*) measured by CIE 1976 space between a target surface after a burned surface is removed and a part which is ground by 2 mm from the target surface by means of a surface grinding machine is 3.0 or less.

4. The sputtering target according to claim 1, which has a specific resistance of 30 mΩcm or less and a relative density of 90% or more.

5. The sputtering target according to claim 1, wherein the element X is Zr.

6. An oxide thin film produced by using the sputtering target according to claim 1.

7. A thin film transistor using the oxide thin film according to claim 6.

8. A method for producing a sputtering target, the sputtering target comprising indium (In), tin (Sn) and zinc (Zn) and an oxide comprising one or more elements X selected from the following group X, an atomic ratio of the elements satisfying the following formulas 1 to 4 and the method comprising:

a step A of mixing and pulverizing indium oxide powder and an oxide of element X;

a step B of subjecting a mixture powder obtained in the step A to calcination at 700 to 1200° C.; and a step C of adding tin oxide powder and zinc oxide powder to a heat-treated powder obtained in the step B and mixing and pulverizing;

Group X: Mg, Si, Al, Sc, Ti, Y, Zr, Hf, Ta, La, Nd, Sm $$0.10 \leq \text{In}/(\text{In}+\text{Sn}+\text{Zn}) \leq 0.85 \tag{1}$$

$$0.01 \leq \text{Sn}/(\text{In}+\text{Sn}+\text{Zn}) \leq 0.40 \tag{2}$$

$$0.10 \leq \text{Zn}/(\text{In}+\text{Sn}+\text{Zn}) \leq 0.70 \tag{3}$$

$$0.70 \leq \text{In}/(\text{In}+\text{X}) \leq 0.99 \tag{4}$$

* * * * *